US010067424B2

(12) United States Patent
Endres et al.

(10) Patent No.: US 10,067,424 B2
(45) Date of Patent: Sep. 4, 2018

(54) ILLUMINATION INTENSITY CORRECTION DEVICE FOR PREDEFINING AN ILLUMINATION INTENSITY OVER AN ILLUMINATION FIELD OF A LITHOGRAPHIC PROJECTION EXPOSURE APPARATUS

(71) Applicant: Carl Zeiss SMT GmbH, Oberkochen (DE)

(72) Inventors: Martin Endres, Koenigsbronn (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 323 days.

(21) Appl. No.: 14/500,370

(22) Filed: Sep. 29, 2014

(65) Prior Publication Data
US 2015/0015865 A1    Jan. 15, 2015

Related U.S. Application Data

(63) Continuation of application No. PCT/EP2013/056456, filed on Mar. 27, 2013.
(Continued)

(30) Foreign Application Priority Data

Apr. 11, 2012    (DE) .................. 10 2012 205 886

(51) Int. Cl.
G03B 27/72    (2006.01)
G03F 7/20    (2006.01)

(52) U.S. Cl.
CPC ........ *G03F 7/70191* (2013.01); *G03F 7/7015* (2013.01); *G03F 7/70066* (2013.01);
(Continued)

(58) Field of Classification Search
CPC ............. G03F 7/70066; G03F 7/70083; G03F 7/70091; G03F 7/701; G03F 7/70108;
(Continued)

(56) References Cited

U.S. PATENT DOCUMENTS 5,473,410 A * 12/1995 Nishi .................. G03F 7/70066
355/53
6,859,515 B2    2/2005 Schultz et al.
(Continued)

FOREIGN PATENT DOCUMENTS

DE    10 2008 013 229    6/2009
DE    10 2008 001 553 A1    11/2009
(Continued)

OTHER PUBLICATIONS

German Office Action, with translation thereof, for corresponding DE Appl No. 10 2012 205 886.9, dated Nov. 23, 2012.
(Continued)

*Primary Examiner* — Christina Riddle
(74) *Attorney, Agent, or Firm* — Fish & Richardson P.C.

(57) ABSTRACT

An illumination intensity correction device serves for predefining an illumination intensity over an illumination field of a lithographic projection exposure apparatus. The correction device has a plurality of bar-shaped individual stops arranged alongside one another and having bar axes arranged parallel to one another, which are arranged in a manner lined up alongside one another transversely with respect to the bar axes. The individual stops are displaceable into a predefined intensity correction displacement position at least along their respective bar axis with the aid of a displacement drive individually for the purpose of predefining an intensity correction of an illumination of the illumination field.

18 Claims, 6 Drawing Sheets

Related U.S. Application Data

(60) Provisional application No. 61/622,584, filed on Apr. 11, 2012.

(52) U.S. Cl.
CPC ...... G03F 7/70083 (2013.01); G03F 7/70091 (2013.01); G03F 7/70141 (2013.01)

(58) Field of Classification Search
CPC ............. G03F 7/70125; G03F 7/70141; G03F 7/7015; G03F 7/70191; G03F 7/70891
USPC ..................... 355/30, 52, 53, 55, 67–71, 77; 250/492.1, 492.2, 492.22, 492.23, 493.1, 250/504 R, 505.1, 515.1, 548
See application file for complete search history.

(56) References Cited

U.S. PATENT DOCUMENTS

| | | | |
|---|---|---|---|
| 8,937,708 B2 | 1/2015 | Endres et al. | |
| 2003/0063266 A1* | 4/2003 | Leenders | G03F 7/70066 355/53 |
| 2006/0139608 A1 | 6/2006 | Wiener et al. | |
| 2006/0244941 A1 | 11/2006 | Gruner et al. | |
| 2007/0268473 A1* | 11/2007 | Kawahara | G03F 7/70066 355/67 |
| 2008/0013680 A1 | 1/2008 | Singer et al. | |
| 2009/0073404 A1* | 3/2009 | Muramatsu | G03F 7/70066 355/53 |
| 2010/0002220 A1 | 1/2010 | Tanaka | |
| 2010/0253926 A1 | 10/2010 | Endres et al. | |
| 2011/0096317 A1 | 4/2011 | Stuetzle et al. | |
| 2011/0194089 A1 | 8/2011 | Sigel et al. | |

FOREIGN PATENT DOCUMENTS

| | | | | |
|---|---|---|---|---|
| DE | WO 2009135576 A1 * | 11/2009 | ......... | G03F 7/70066 |
| DE | 10 2011 003 145 A1 | 8/2011 | | |
| EP | 0 952 491 A2 | 10/1999 | | |
| EP | 1 225 481 A | 7/2002 | | |
| EP | 2 031 640 A1 | 3/2009 | | |
| JP | H 1083957 | 3/1998 | | |
| JP | 2006-049679 | 2/2006 | | |
| JP | 2010-016376 | 1/2010 | | |
| JP | 2011-507241 | 3/2011 | | |
| JP | 2011-155040 | 8/2011 | | |
| WO | WO 2007/145139 A1 | 12/2007 | | |
| WO | WO 2009/074211 A1 | 6/2009 | | |
| WO | WO 2010/001945 A1 | 1/2010 | | |

OTHER PUBLICATIONS

International Search Report for corresponding PCT Appl No. PCT/EP2013/056456, dated Aug. 21, 2013.

Japanese office action, with English translation thereof, for corresponding JP Appl No. 2015-504898, dated Jan. 11, 2017, 9 pages.

* cited by examiner

ILLUMINATION INTENSITY CORRECTION DEVICE FOR PREDEFINING AN ILLUMINATION INTENSITY OVER AN ILLUMINATION FIELD OF A LITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2013/056456, filed Mar. 27, 2013, which claims benefit under 35 USC 119 of German Application No. 101 2012 205 886.9, filed Apr. 11, 2012. International application PCT/EP2013/056456 also claims priority under 35 USC 119(e) to U.S. Provisional Application No. 61/622,584, filed Apr. 11, 2012. The entire disclosure of international application PCT/EP2013/056456 and German patent application DE 10 2012 205 886.9 shall are incorporated by reference herein.

The invention relates to an illumination intensity correction device for predefining or specifying an illumination intensity over an illumination field of a lithographic projection exposure apparatus. Furthermore, the invention relates to an illumination optical unit for guiding illumination light toward an illumination field of a lithographic projection exposure apparatus comprising such an illumination intensity correction device, an illumination system comprising such an illumination optical unit, a projection exposure apparatus comprising such an illumination system, a method for producing a micro- or nanostructured component with such a projection exposure apparatus, and a component structured by such a production method.

WO 2009/074 211 A1 discloses a correction device via which a uniform intensity distribution in an illumination field can be set by way of a transverse coordinate transversly with respect to a displacement direction of an object displaced during the projection exposure, within specific tolerance limits.

It is an objective of the present invention to develop an illumination intensity correction device of the type mentioned in the introduction in such a way that a correction accuracy is improved in comparison with the prior art.

This objective is achieved according to the invention via an illumination intensity correction device comprising a plurality of bar-shaped individual stops arranged alongside one another and having bar axes arranged parallel to one another, which are arranged in a manner lined up alongside one another transversely with respect to the bar axes. The individual stops are displaceable into a predefined intensity correction displacement position at least along their respective bar axis with the aid of a displacement drive individually for the purpose of predefining an intensity correction of an illumination of the illumination field. Some of the individual stops are embodied as field delimiting individual stops such that they are displaceable along their bar axis between a completely extended extension position and a completely retracted retraction position by more than a field extent of the illumination field which the latter has along the bar axis. The objective is also achieved by an illumination intensity correction device comprising a plurality of bar-shaped individual stops arranged alongside one another and having bar axes arranged parallel to one another, which are arranged in a manner lined up alongside one another transversely with respect to the bar axes. The individual stops are displaceable into a predefined intensity correction displacement position at least along their respective bar axis with the aid of a displacement drive individually for the purpose of predefining an intensity correction of an illumination of the illumination field. At least some of the individual stops are embodied as field delimiting individual stops such that they are displaceable along their bar axis between a completely extended extension position and a completely retracted retraction position by more than a field extent of the illumination field which the latter has along the bar axis. The bar axis of the field delimiting individual stops and a displacement direction of the field delimiting individual stops between the extension position and the retraction position run parallel to an object displacement direction of an object to be illuminated. The individual stops have the form of bars or sticks.

It has been recognized according to the invention that, if some of the individual stops are embodied as field delimiting individual stops, the need for a separate field delimiting stop, which was used in the prior art in addition to the illumination intensity correction device, is obviated. The illumination intensity correction device, on the one hand, and this field delimiting stop, now no longer necessary, then no longer compete for a structural space near a field plane of the illumination field. The illumination intensity correction device can then move correspondingly near to the field plane, such that the correction device can manifest a correction effect that is independent of illumination angles on the illumination field to the greatest possible extent. The displaceability of the field delimiting individual stops between the completely extended extension position and the completely retracted retraction position can be e.g. more than 8 mm, more than 10 mm, more than 12 mm or else more than 15 mm. Via the field delimiting individual stops that are displaceable in this way, these individual stops can delimit the illumination field in a transverse dimensions transversely with respect to the bar axes of the individual stops.

In an alternative embodiment of the illumination intensity correction device, all the individual stops are embodied as field delimiting individual stops such that they are displaceable along their bar axis between a completely extended extension position and a completely retracted retraction position by more than a field extent of the illumination field which the latter has along the bar axis.

A displacement of the field delimiting individual stops along their bar axis parallel to the object displacement direction makes possible a configuration in which illumination field regions between the field delimiting individual stops remain uninfluenced in the case of a displacement of the field delimiting individual stops. The field delimiting individual stops do not marginally change their coordinate perpendicular to the object displacement direction, that is to say act on the illumination field at exactly one field height.

The individual stops can be embodied such that they can be introduced into the illumination field from one and the same side.

A two-stage displacement drive comprises a first stage in the form of an intensity correction displacement actuator for displacing the field delimiting individual stops between different intensity correction displacement positions, and a second stage in the form of a field delimiting displacement actuator for displacing the field delimiting individual stops between a neutral position, which does not influence the illumination field, and a field delimiting position. Such a two-stage displacement drive avoids the need for a displacement drive which, on the one hand, for the purpose of intensity correction, is movable with high positioning accuracy and, on the other hand, for the purpose of field delimiting, is displaceable with high displacement travel. The requirements of "high positional accuracy", on the one hand, and "high displacement travel", on the other hand, are distributed between the two stages of the displacement drive. In this case, the first stage can have a positional accuracy of better than 25 µm, of better than 10 µm or even of better than 5 µm. The positional accuracy of the second stage is unimportant, but should, of course, have a magnitude such that a positional tolerance of the second stage can be compensated for by the possible adjusting travel of the first stage.

A transverse displacement drive makes possible a variable adaptation of a field delimiting by the field delimiting individual stops in a dimension transversely with respect to the bar axes. The field delimiting individual stops can then precisely delimit illumination fields having different field extents transversely with respect to the bar axis of the individual stops. Such a transverse displacement drive can be embodied, in particular, integrally with the second stage of a two-stage displacement drive as described above.

An adaptation of the individual stops to a boundary shape of the illumination field makes possible a particularly precise illumination intensity predefinition. An end edge of the individual stops can be embodied in an obliquely tapering fashion, e.g. at an angle of 45° with respect to the bar axis. An end edge of the individual stops can be embodied in an arcuate fashion.

A cooling unit to cool at least some of the individual stops makes it possible to tolerate a high thermal load in particular on the field delimiting individual stops. The cooling unit can be embodied as water cooling.

An illumination intensity correction device adapted to a rectangular illumination field and an alternative correction device, adapted to an arcuate illumination field, is adapted to the illumination field shapes customary for EUV projection exposure apparatuses.

The advantages of an illumination optical unit for guiding illumination light toward an illumination field of a lithographic projection exposure apparatus, wherein the unit includes an illumination intensity correction device described above, correspond to those which have already been explained above with reference to the correction device.

A correction device spaced by not more than 20 mm from a field plane of the illumination optical unit is particularly precise with regard to an illumination-direction-independent illumination intensity predefined effect. The distance between a correction plane, in which the illumination intensity correction device is arranged, and the field plane of the illumination optical unit can be not more than 10 mm or else not more than 8 mm.

The advantages of an illumination system including an illumination optical unit described above and a projection optical unit, and of a projection exposure apparatus including such an illumination system, correspond to those which have already been explained above with reference to the correction device and the illumination optical unit. The light source of the projection exposure apparatus can be an EUV light source. The advantages of the correction device are manifested particularly well here.

In the case of a scanning projection exposure apparatus, the advantages of the correction device are manifested particularly well.

A displacement drive makes it possible additionally to give the correction device the function of a concomitantly running scanning stop, such that the concomitantly running scanning stop can also be replaced by the correction device, which additionally leaves competition for structural space and makes it possible to arrange the correction device very near to the field plane of the illumination optical unit.

The advantages of a method and of a micro- or nano-structured component correspond to those which have already been explained above.

Exemplary embodiments of the invention are explained in greater detail below with reference to the drawing, in which.

Figure 1:
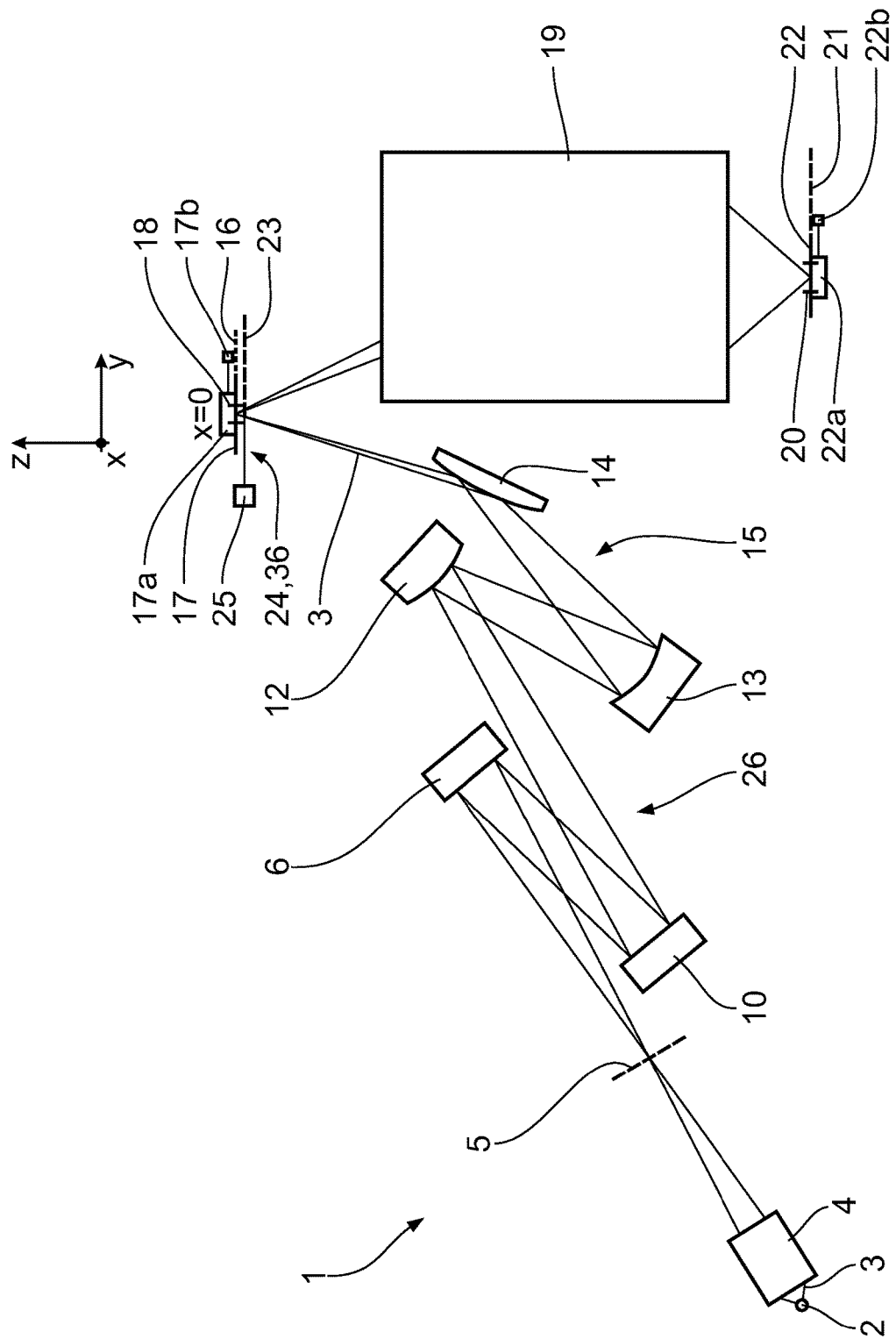
FIG. 1 shows schematically and with regard to an illumination optical unit in meridional section a projection exposure apparatus for microlithography.

A projection exposure apparatus 1 for microlithography serves for producing a micro- or nanostructured electronic semiconductor component. A light source 2 emits EUV radiation used for illumination in the wavelength range of, for example, between 5 nm and 30 nm. The light source 2 can be a GDPP source (gas discharge produced plasma) or an LPP source (laser produced plasma). A radiation source based on a synchrotron can also be used for the light source 2. Information concerning a light source of this type can be found by the person skilled in the art in U.S. Pat. No. 6,859,515 B2, for example. EUV illumination light or illumination radiation in the form of an imaging light beam 3 is used for illumination and imaging within the projection exposure apparatus 1. Downstream of the light source 2, the imaging light beam 3 firstly passes through a collector 4, which can be, for example, a nested collector having a multi-shell construction known from the prior art or, alternatively, an ellipsoidally shaped collector, which is then arranged behind the light source 2. A corresponding collector is known from EP 1 225 481 A. Downstream of the collector 4, the EUV illumination light 3 firstly passes through an intermediate focal plane 5, which can be used for separating the imaging light beam 3 from undesired radiation or particle portions. After passing through the intermediate focal plane 5, the imaging light beam 3 firstly impinges on a field facet mirror 6.

In order to facilitate the description of positional relationships, a Cartesian global xyz coordinate system is in each case depicted in the drawing. In FIG. 1, the x-axis runs perpendicular to the plane of the drawing and out of the latter. The y-axis runs toward the right in FIG. 1. The z-axis runs upward in FIG. 1.

In order to facilitate the description of positional relationships in the case of individual optical components of the projection exposure apparatus 1, a Cartesian local xyz or xy coordinate system is in each case also used in the following figures. The respective local xy coordinates span, unless described otherwise, a respective principal arrangement plane of the optical component, for example a reflection plane. The x-axes of the global xyz coordinate system and of the local xyz or xy coordinate systems run parallel to one another. The respective y-axes of the local xyz or xy coordinate systems have an angle with respect to the y-axis of the global xyz coordinate system, which corresponds to a tilting angle of the respective optical component about the x-axis.

Figure 4:
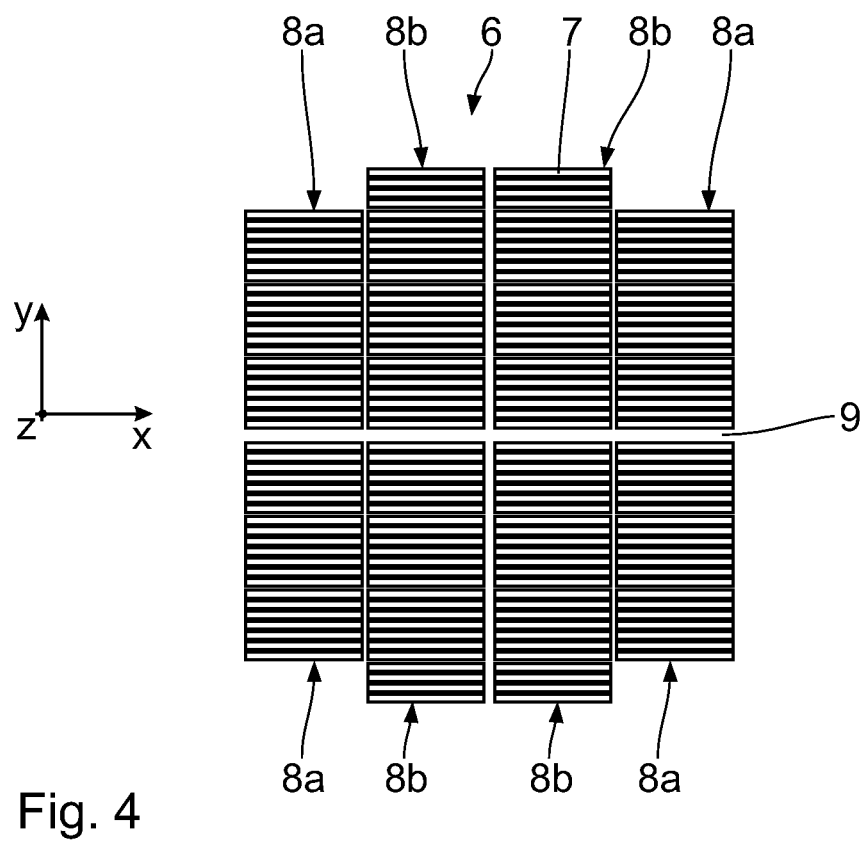
FIG. 4 shows a view of a facet arrangement of a field facet mirror of the illumination optical unit of the projection exposure apparatus according to FIG. 1 in the "rectangular field" embodiment.

FIG. 4 shows, by way of example, a facet arrangement of field facets 7 of the field facet mirror 6 in the "rectangular field" embodiment. The field facets 7 are rectangular and each have the same x/y aspect ratio. The x/y aspect ratio can be for example 12/5, can be 25/4, can be 104/8, can be 20/1 or can be 30/1.

The field facets 7 predefine a reflection surface of the field facet mirror 6 and are grouped in four columns each having six to eight field facet groups 8a, 8b. The field facet groups 8a each have seven field facets 7. The two additional marginal field facet groups 8b of the two central field facet columns each have four field facets 7. Between the two central facet columns and between the third and fourth facet rows, the facet arrangement of the field facet mirror 6 has interspaces 9, in which the field facet mirror 6 is shaded by holding spokes of the collector 4. If an LPP source is used as the light source 2, a corresponding shading can also arise as a result of a tin droplet generator which is arranged adjacent to the collector 4 and is not illustrated in the drawing.

After reflection at the field facet mirror 6, the imaging beam light 3 split into imaging light partial beams which are assigned to the individual field facets 7 impinges on a pupil facet mirror 10. The respective imaging light partial beam of the total imaging light beam 3 is guided along a respective imaging light channel.

Figure 5:
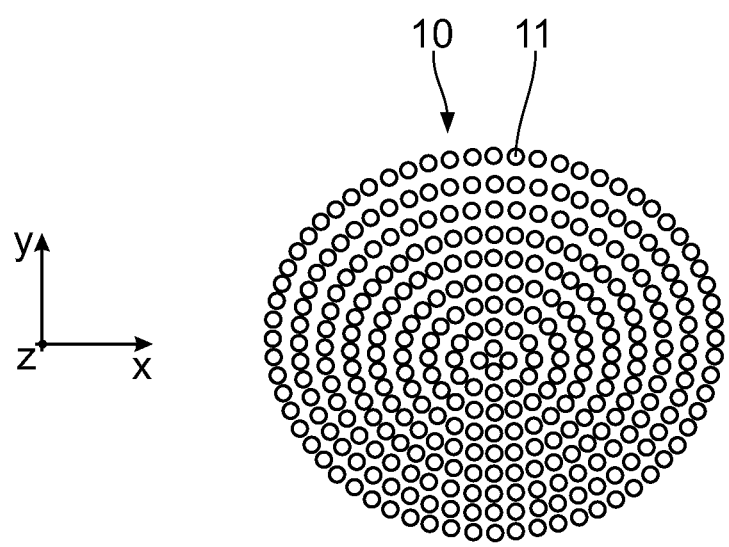
FIG. 5 shows a view of a facet arrangement of a pupil facet mirror of the illumination optical unit of the projection exposure apparatus according to FIG. 1.

FIG. 5 shows an exemplary facet arrangement of round pupil facets 11 of the pupil facet mirror 10. The pupil facets 11 are arranged around a center in facet rings situated one in another. A pupil facet 11 is assigned to each imaging light partial beam of the EUV illumination light 3 reflected by one of the field facets 7, such that a respective facet pair impinged upon and comprising one of the field facets 7 and one of the pupil facets 11 predefines the imaging light channel for the associated imaging light partial beam of the EUV illumination light 3. The channel-by-channel assignment of the pupil facets 11 to the field facets 7 is effected depending on a desired illumination by the projection exposure apparatus 1.

Via the pupil facet mirror 10 (FIG. 1) and a downstream transfer optical unit 15 consisting of three EUV mirrors 12, 13, 14, the field facets 7 are imaged into an object plane 16 of the projection exposure apparatus 1. The EUV mirror 14 is embodied as a mirror for grazing incidence (grazing incidence mirror). Arranged in the object plane 16 is a reticle 17, from which, with the EUV illumination light 3, an illumination region is illuminated which coincides with an object field 18 of a downstream projection optical unit 19 of the projection exposure apparatus 1. The illumination region is also designated as the illumination field. The object field 18 is rectangular or arcuate depending on the concrete embodiment of an illumination optical unit of the projection exposure apparatus 1. The imaging light channels are superimposed in the object field 18. The EUV illumination light 3 is reflected from the reticle 17. The reticle 17 is retained by an object holder 17a, which is displaceable along the displacement direction y in a driven manner with the aid of an object displacement drive 17b indicated schematically.

The projection optical unit 19 images the object field 18 in the object plane 16 into an image field 20 in an image plane 21. Arranged in the image plane 21 is a wafer 22, which bears a light-sensitive layer that is exposed during the projection exposure via the projection exposure apparatus 1. The wafer 22 that is to say the substrate onto which imaging is effected, is retained by a wafer or substrate holder 22a, which is displaceable along the displacement direction y with the aid of a wafer displacement drive 22b, likewise indicated schematically, synchronously with the displacement of the object holder 17a. During the projection exposure, both the reticle 17 and the wafer 22 are scanned in a synchronized manner in the y-direction. The projection exposure apparatus 1 is embodied as a scanner. The scan direction y is the object displacement direction.

Arranged in a correction plane 23 is an illumination intensity correction device 24, which will be explained in greater detail below. The correction plane 23 is spaced apart from the object plane 16 by not more than 20 mm, for example by 6 mm, 8 mm, 10 mm or 16 mm. The correction device 24, which is also designated as UNICOM, serves inter alia for predefining or setting a scan-integrated, that is to say integrated in the y-direction, intensity distribution of the illumination light over the object field 18. The correction device 24 is driven by a control unit 25. Examples of a field correction device are known from WO 2009/074 211 A1, EP 0 952 491 A2 and from DE 10 2008 013 229 A1.

The field facet mirror 6, the pupil facet mirror 10, the mirrors 12 to 14 of the transfer optical unit 15 and the correction device 24 are parts of an illumination optical unit 26 of the projecting exposure apparatus 1. Together with the projection optical unit 19 the illumination optical unit 26 forms an illumination system of the projection exposure apparatus 1.

Figure 2:
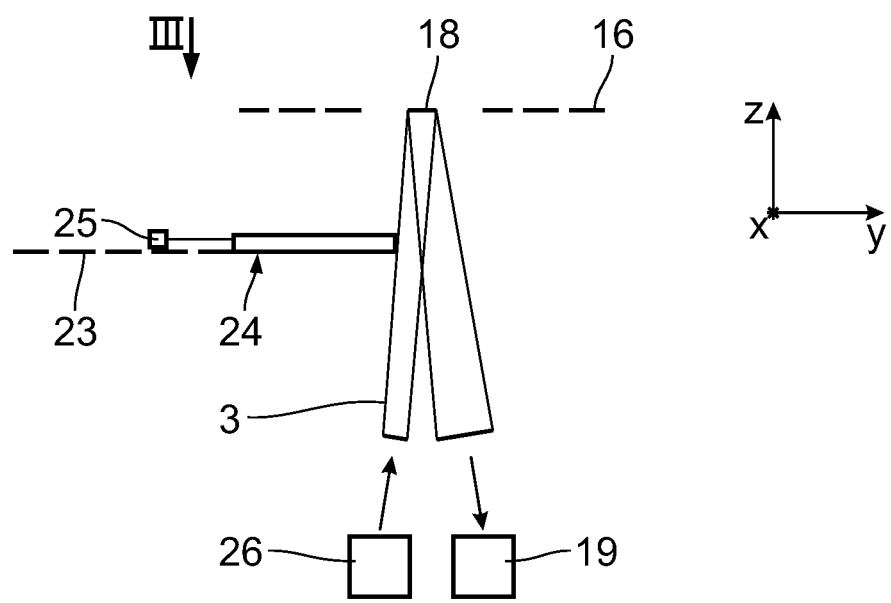
FIG. 2 shows an excerpt enlargement from FIG. 1 in the region of a reticle plane or object plane.
Figure 3:
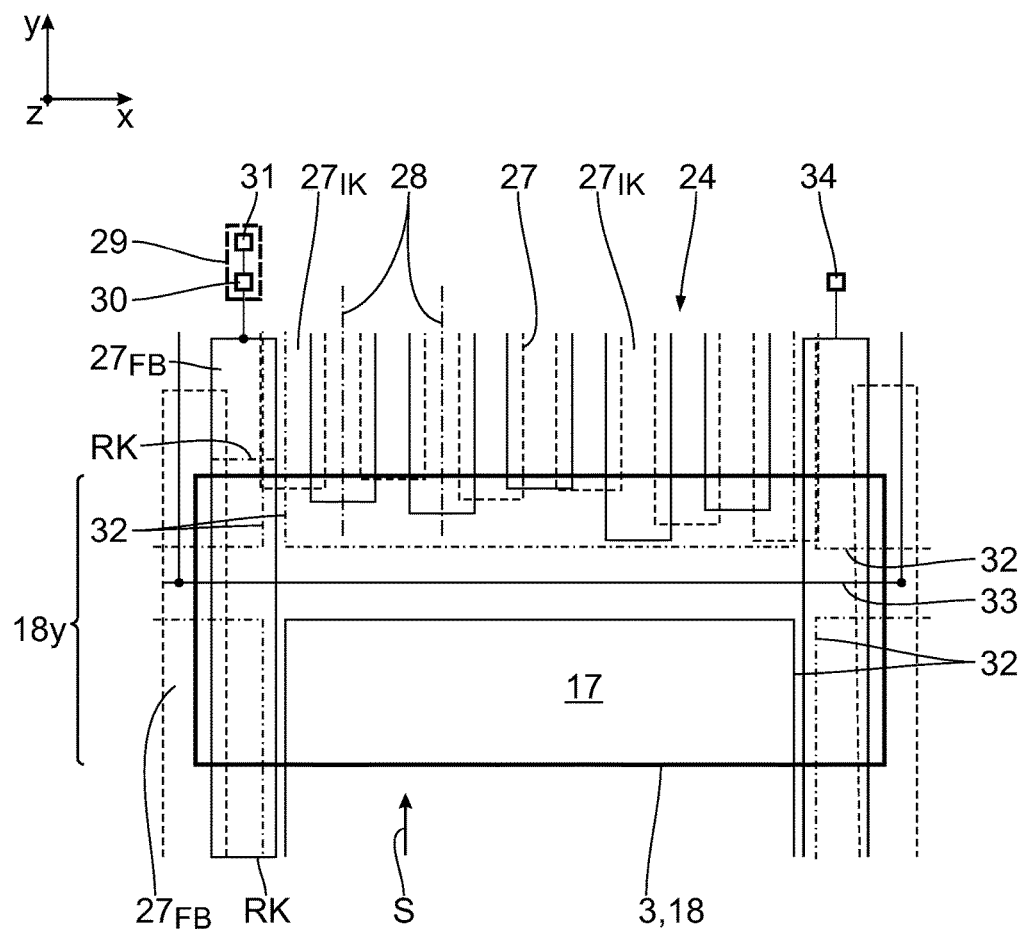
FIG. 3 shows a view of a correction device of the projection exposure apparatus from viewing direction III in FIG. 2 in the "rectangular field" embodiment.

FIGS. 2 and 3 show the correction device 24 in greater detail. FIG. 2 shows an enlarged illustration in comparison with FIG. 1 with some additional details, which is not true to scale with respect to FIG. 1. FIG. 3 shows a plan view of the object field 18 illuminated with a beam of the illumination light 3, the beam having a correspondingly rectangular boundary, together with details of the illumination intensity correction device 24 and further details.

The correction device 24 has a plurality of bar- or stick-shaped individual stops 27 arranged alongside one another. In the embodiment according to FIGS. 2 and 3, e.g. fifteen individual stops 27 having a respective width in the x-direction of 4 mm can be present. A different number of individual stops 27 is also possible, e.g. more than fifteen, more than twenty or more than twenty-five individual stops 27. The individual stops 27 can have a different width in the x-direction, e.g. less than 4 mm, in particular 1 mm, 2 mm, 3 mm or more than 4 mm, in particular 5 mm. These individual stops 27 are directly adjacent to one another or, as illustrated in FIG. 3, also overlap partly in the x-direction. In the case of a partial overlap, adjacent individual stops 27 lie in planes as closely adjacent to one another as possible parallel to the object plane 6. Every second one of the individual stops 27 is illustrated by dashed lines in FIG. 3. The individual stops 27 illustrated by solid lines are arranged in a first plane parallel to the xy plane and the individual stops illustrated by dashed lines are arranged in a second plane, closely adjacent here, likewise parallel to the xy plane.

Bar axes 28, that is to say central longitudinal axes of the bar-shaped individual stops 27, run parallel to one another along the y-direction. The individual stops 27 are arranged in a manner lined up alongside one another transversely with respect to the bar axes 28, that is to say along the x-direction.

Along their respective bar axis 28, the individual stops 27 are displaceable with the aid respectively of a two-stage displacement drive 29. The displacement drive 29 for one of the individual stops 27 is indicated schematically in FIG. 3. A first stage of the displacement drive 29 is embodied in the form of an intensity correction displacement actuator 30. The intensity correction displacement actuator 30 serves for displacing the respective individual stop 27 between different intensity correction displacement positions, some of which are illustrated for the individual stops $27_{IK}$ in FIG. 3. The displacement into the respective intensity correction displacement position serves for individually predefining a scan-integrated intensity correction of an illumination of the illumination field 18.

Different intensity correction displacement positions differ in how far the respective individual stop 27 is introduced in the y-direction into the illumination field 18, that is to say into the beam of illumination light 3 coinciding therewith.

All the individual stops 27 are inserted into the EUV illumination light 3 from one and the same side.

With the aid of the control unit 25, the individual stops 27 can be set into a predefined position in the y direction independently of one another. Depending on the field height, that is to say the x-position, at which an object point on the reticle 17 passes the object field 18, the scanning distance of the object point in the y-direction and thus the integrated intensity of the imaging light partial beams—superimposed at the x-position—of the total imaging light beam 3 that is experienced by the object point are determined by the y-position of the respective individual stop $27_{IK}$. In this way, a predefined distribution of the intensity of the imaging light partial beam 3 which illuminates the reticle 17 can be achieved via a predefinition of the y-positions of the individual stops $27_{IK}$.

The displacement accuracy of the intensity correction displacement actuator 30 along the y-direction is very high in comparison with the y-extent of the illumination field 18 of approximately 8 mm and can achieve an accuracy of, for example, less than 10 μm, for example in the range of 5 μm or even also below that.

The intensity correction displacement actuators 30 can be embodied as linear actuators having a piezoelectric operative principle, having an electrostatic operative principle, having an electromagnetic operative principle, having a magnetostrictive operative principle or having a thermoelectric operative principle.

At least some of the individual stops 27 of the illumination intensity correction device 24 are embodied as field delimiting individual stops $27_{FB}$. The field delimiting individual stops $27_{FB}$ are displaceable along their respective bar axis 28 between a completely extended extension position and a completely retracted retraction position by more than a field extent $18_y$ of the illumination field 18 as measured in the scanning direction y. This displaceability of the field delimiting individual stops $27_{FB}$ is illustrated in FIG. 3 for the two individual stops 27 illustrated on the far left therein and for the two individual stops 27 illustrated on the far right therein, in a respective extension position. This displaceability is realized by a second stage of the displacement drive 29 in the form of a field delimiting displacement actuator 31. The field delimiting displacement actuator 31 therefore serves for displacing the field delimiting individual stops $27_{FB}$ between a neutral position, which does not influence the illumination field 18, that is to say for example the completely retracted retraction position, and a field delimiting position, that is to say for example the completely extended extension position.

FIG. 3 shows, for that field delimiting individual stop $27_{FB}$, for which the displacement drive 29 is illustrated by way of example, the position of an end-side marginal edge RK in the completely extended extension position (that is to say introduced into the illumination field 18) using solid lines and in the completely retracted retraction position (that is to say moved out of the illumination field 18) using dash-dotted lines.

In practice, the field delimiting displacement actuator 31 makes it possible, for example, to displace the field delimiting individual stops $27_{FB}$ between the retraction position and the extension position by 10 mm or by 15 mm.

The field delimiting displacement actuators 31 can be configured with operative principles comparable to those of the intensity correction displacement actuators 30, the difference being the greater maximum travel that can be achieved, or can be embodied with an operative principle that differs from the operative principle of the intensity correction displacement actuators 30. Possible further operative principles of this type for the field delimiting displacement actuators 31 are a screw drive, for example a ball screw drive, a roller screw drive, in particular a roller screw drive with roller recirculation or a planetary roller screw drive, a hydraulic cylinder, a pneumatic cylinder or a linear motor having an electrodynamic operative principle.

The field delimiting displacement actuator 31 can be embodied as a pure y-displacement actuator for displacing the field delimiting individual stop $27_{FB}$ along the bar axis 28. Alternatively, the field delimiting displacement actuator 31 can additionally be embodied as an x-displacement actuator in such a way that the associated field delimiting individual stop $27_{FB}$ is also displaceable transversely with respect to its bar axis 28, that is to say along the x-direction. In this case, a maximum x-displacement distance can be half the x-width of the field delimiting individual stops $27_{FB}$, that is to say e.g. 2 mm. Such an embodiment of the field delimiting displacement actuator 31 additionally as an x-displacement actuator can be used particularly when the individual stops 27 of the correction device 24 overlap in the x-direction, as already explained above. In this case, an overlap of adjacent individual stops $27_{FB}$ is of at least the same magnitude as the maximum x-displacement distance. The field delimiting individual stops $27_{FB}$ can, as likewise already mentioned above, be arranged in at least two or else in more than two planes as closely adjacent to one another as possible parallel to the object plane 16.

In an alternative embodiment, an x-displacement actuator of the displacement drive 29 can also be embodied as a separate actuator relative to the x-field delimiting displacement actuator 31.

FIG. 3 additionally illustrates the reticle 17 during a scanning displacement (cf. arrow S in FIG. 3) through the illumination field 18. The reticle 17 has original images 32 arranged alongside one another in a grid-like fashion in the manner of an xy array, that is to say those regions or sections on the reticle 17 in the object plane 16 which are to be illuminated for the purpose of illuminating a predefined imaging section on the wafer 22. That original image 32 which is illuminated during the scanning step illustrated in FIG. 3 is illustrated by solid lines. Object field sections 32 which are likewise designated as original images and which are associated with wafer sections which are not intended to be illuminated during the given illumination operation are illustrated by dash-dotted lines in FIG. 3.

The field delimiting individual stops $27_{FB}$ shade those original images 32 which adjoin the original image 32 to be illuminated in the x-direction.

In addition, FIG. 3 also illustrates a y-scanning stop 33, which is concomitantly displaced in the scanning direction with the reticle 17 during scanning and protects wafer sections which are adjacent in the y-direction, by virtue of the y-scanning stop 33 shading adjacent original images 32 of the reticle 17, which are illustrated by dashed lines.

In an alternative embodiment of the correction device 24, the displacement drive 29 for the individual stops $27_{IK}$ is embodied such that it makes possible a displacement speed of the individual stops $27_{IK}$ in the scanning direction which is as fast as an object displacement speed of the object displacement drive 17b. In this case, the intensity correction individual stops $27_{IK}$ can perform the function of the y-scanning stop. During the scanning operation, the intensity correction individual stops $27_{IK}$, during a section of the scanning path, shade the original image 32 which is adjacent to the original image 32 to be illuminated in the y-direction. During this shading, the intensity correction individual stops $27_{IK}$ concomitantly move synchronously with the reticle 17 until they reach their respective intensity correction displacement position, as illustrated by way of example in FIG. 3. The intensity correction individual stops $27_{IK}$ then remain in this intensity correction displacement position until the original image 32 to be illuminated has been completely scanned through the illumination field 18.

A further y-scanning stop, which is not illustrated in FIG. 3, can be provided in order to shade a downstream original image 32 in the scanning direction S, this downstream y-scanning stop then likewise moving as fast as the object displacement speed of the object displacement drive 17b.

Depending on the illumination width actually to be set in the x-direction, those individual stops 27 which function as field delimiting individual stops $27_{FB}$ are selected. With the aid of the control unit 25, the field delimiting individual stops $27_{FB}$ are brought into the correct field delimiting position both in the x-direction and in the y-direction. The individual stops 27 between the field delimiting individual stops $27_{FB}$ are then brought into the required intensity correction displacement position by the control unit 25 or alternatively are initially concomitantly scanned with an original image which is not to be illuminated, as already explained above, in order to additionally perform the function of the y-scanning stop 33.

At least the field delimiting individual stops $27_{FB}$ can have a cooling unit 34. This can involve e.g. water cooling or Peltier cooling. For this purpose, the field delimiting individual stops $27_{FB}$ can be produced from a material having a very good thermal conductivity. In the case of water cooling or cooling by some other flowing fluid, the individual stops can be provided with passage channels through which a heat-dissipating heat carrier fluid flows, which is fed from a heat carrier fluid source to the cooling unit 34.

Figure 7:
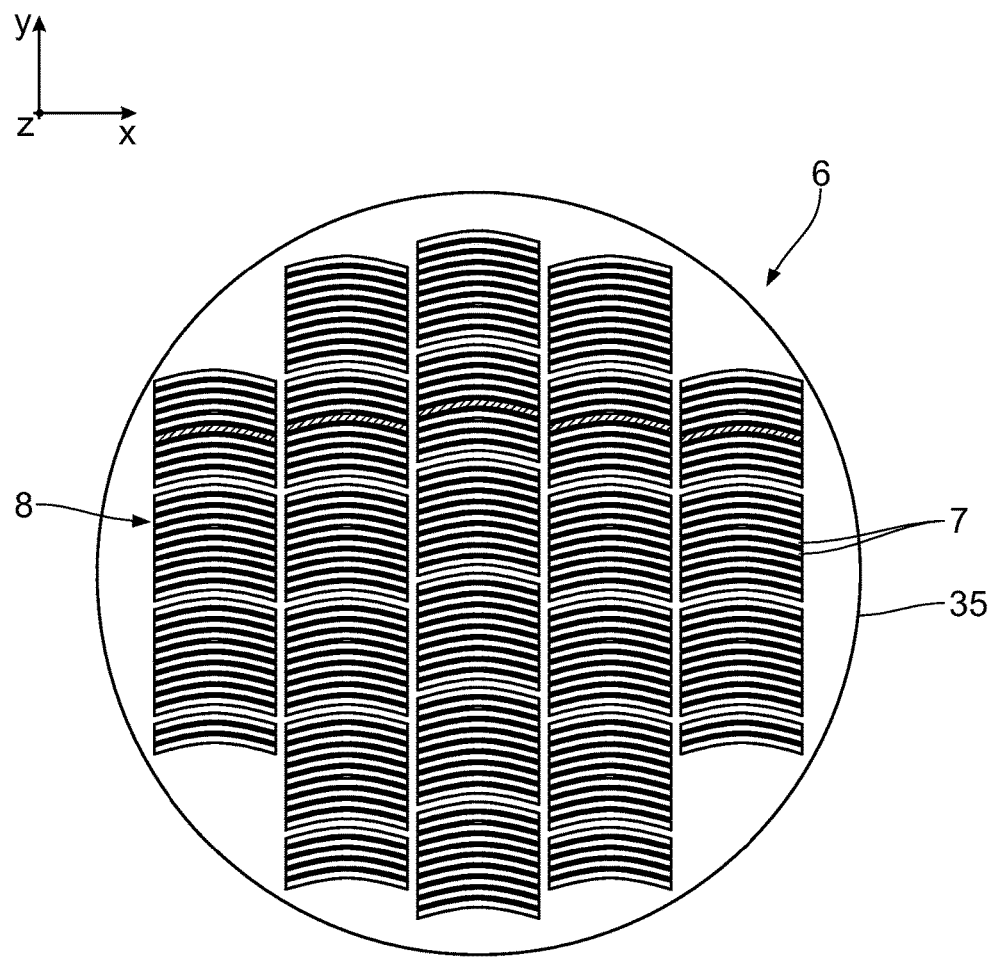
FIG. 7 shows, in an illustration similar to FIG. 4, a facet arrangement of a further embodiment of a field facet mirror in the "arcuate field" embodiment.

FIG. 7 shows a further embodiment "arcuate field" of a field facet mirror 6. Components corresponding to those which have been explained above with reference to the field facet mirror 6 according to FIG. 4 bear the same reference numerals and will be explained only insofar as they differ from the components of the field facet mirror 6 according to FIG. 4.

The field facet mirror 6 according to FIG. 7 has a field facet arrangement having curved field facets 7. The field facets 7 are arranged in a total of five columns each having a plurality of field facet groups 8. The field facet arrangement is written into a circular boundary of a carrier plate 35 of the field facet mirror.

The field facets 7 of the embodiment according to FIG. 7 all have the same area and the same ratio of width in the x-direction and height in the y-direction, which corresponds to the x/y aspect ratio of the field facets 7 of the embodiment according to FIG. 4.

Figure 6:
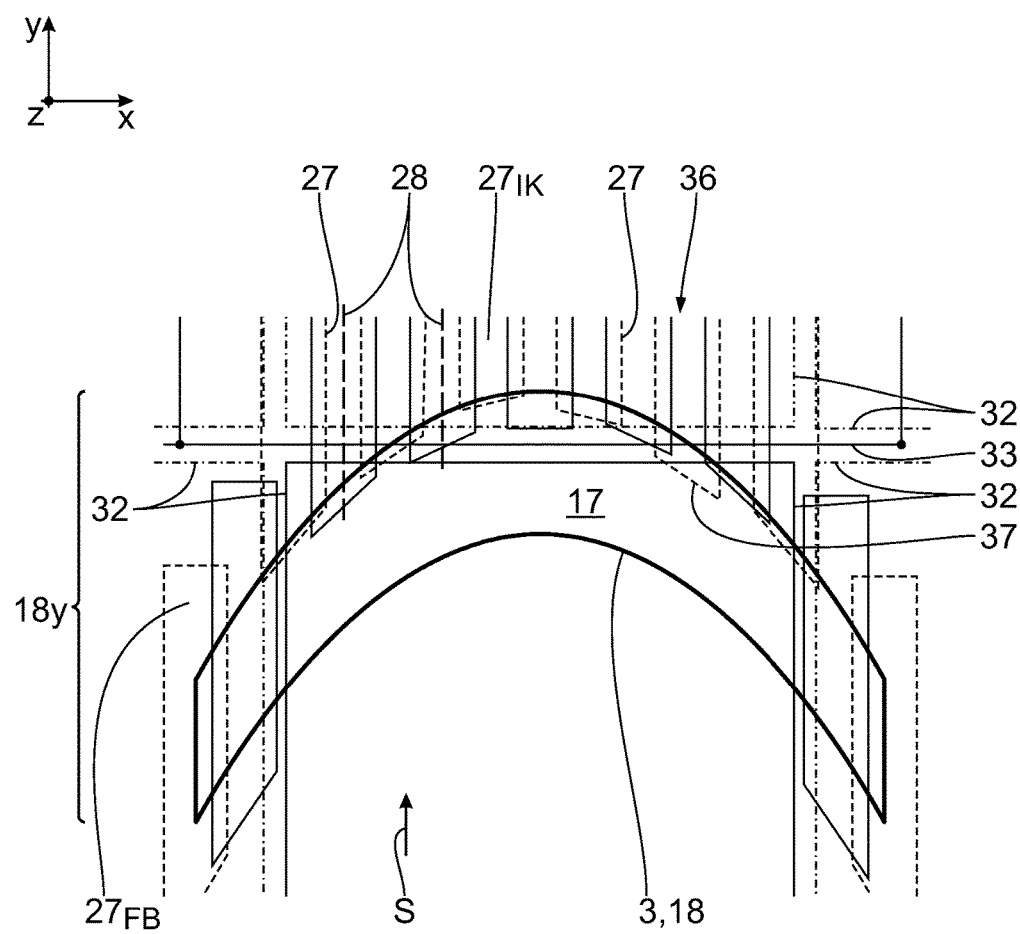
FIG. 6 shows, in a view similar to FIG. 3, a variant of the correction device in the "arcuate field" embodiment.

FIG. 6 shows, in an illustration similar to FIG. 3, a further embodiment of an illumination intensity correction device 36 once again schematically in a plan view, the viewing direction of the observer being directed along the z-direction.

The correction device 36 involves the embodiment for a curved illumination field 18, that is to say for an arcuate field. Such an arcuate field can be generated with the aid of the field facet mirror 6 according to FIG. 7, as is already known in principle from the prior art.

Components of the correction device 36 which correspond to those which have already been explained above with reference to FIGS. 1 to 3 bear the same reference numerals and will not be discussed in detail again. The correction device 36 again has intensity correction individual stops $27_{IK}$ and field delimiting individual stops $27_{FB}$.

Ends 37, that is to say end edges, of the individual stops 27 of the correction device 36 are adapted to an arcuate bounding shape of the illumination field 18. The end edges 37 are embodied as obliquely tapering in a manner adapted for this. Depending on the x-position of the respective intensity correction individual stop $27_{IK}$, the end edge can be shaped in a manner tapering oblique e.g. at an angle of 30°, 40°, 45°, 50° or 60° with respect to the bar axis. Alternatively or additionally, the end edges 37 can also be embodied as arcuately curved in a manner adapted to the arcuate illumination field 18.

During the projection exposure, firstly the reticle 17 and the wafer 22 bearing a coating that is light-sensitive to the illumination light 3 are provided. Subsequently, a section of the reticle 17, namely the original image 32 to be illuminated, is projected onto the wafer 22 with the aid of the projection exposure apparatus 1. Finally, the light-sensitive layer exposed by the illumination light 3 on the wafer 22 is developed. A micro- or nanostructured component, for example a semiconductor chip, is produced in this way.

The invention claimed is:

1. A device, comprising:
   a plurality of individual bar-shaped individual stops; and
   a displacement device,
   wherein:
      each stop has a bar axis;
         the bar axes are parallel to each other;
         the stops are alongside each other along a transverse direction which is perpendicular to the bar axes;
         the displacement device is configured to individually displace each stop into an intensity correction displacement position along its bar axis to define an intensity correction of an illumination of an illumination field of a lithographic projection exposure apparatus;
         for some of the individual stops, the stop is a field delimiting individual stop displaceable along its bar axis by more than an extent of the illumination field along the bar axis; and
      at least some of the individual field delimiting stops are displaceable in the transverse direction.

2. The device of claim 1, wherein the displacement drive comprises:
   a first actuator configured to displace the individual field delimiting stops between different intensity correction positions; and
   a second actuator configured to displace the individual field delimiting stops between a neutral position, which does not influence the illumination field, and a field delimiting position.

3. The device of claim 1, wherein ends of the individual stops are adapted to a boundary shape of the illumination field.

4. The device of claim 1, further comprising a cooling unit configured to cool at least some of the individual stops.

5. The device of claim 1, wherein the illumination field is rectangular.

6. An optical unit configured to guide illumination light toward an illumination field of a lithographic projection exposure apparatus, the optical unit comprising:
the device of claim 1.

7. The optical unit of claim 6, wherein the device is at most 20 mm from a field plane of the illumination optical unit.

8. A system, comprising:
an illumination system comprising an illumination optical unit configured to guide illumination light toward an illumination field of a lithographic projection exposure apparatus, the optical unit comprising the device of claim 1; and
a projection optical unit configured to image an object field into an image field,
wherein the object field coincides at least in sections with the illumination field.

9. A projection exposure apparatus, comprising:
a light source configured to provide illumination light;
an illumination system comprising an illumination optical unit configured to guide illumination light toward an illumination field of a lithographic projection exposure apparatus, the optical unit comprising the device of claim 1; and
a projection optical unit configured to image an object field into an image field,
wherein the object field coincides at least in sections with the illumination field.

10. The projection exposure apparatus of claim 9, further comprising:
an object holder comprising an object displacement drive configured to displace an object to be imaged along an object displacement direction running along the bar axes; and
a wafer holder comprising a wafer displacement drive configured to displace a wafer along an image displacement direction running parallel to the object displacement direction,
wherein the wafer is disposed so that, during use of the projection exposure apparatus, a structure of the object is on the wafer.

11. The projection exposure apparatus of claim 10, wherein the displacement drive for the individual stops is configured so that it makes possible a displacement speed of at least some of the individual stops which is as fast as an object displacement speed of the object displacement drive.

12. A method of using a projection exposure apparatus comprising an illumination system and a projection optical unit, the method comprising:
using the illumination system to illuminate at least a part of a reticle; and
using the projection optical unit to project at least part of the illumination part of the reticle onto a wafer,
wherein the illumination system comprises the optical unit comprising the device of claim 1.

13. A device, comprising:
a plurality of individual bar-shaped individual stops; and
a displacement device,
wherein:
each stop has a bar axis;
the bar axes are parallel to each other;
the stops are alongside each other along a transverse direction which is perpendicular to the bar axes;
the displacement device is configured to individually displace each stop into an intensity correction displacement position along its bar axis to define an intensity correction of an illumination of an illumination field of a lithographic projection exposure apparatus;
for some of the individual stops, the stop is an individual field delimiting stop displaceable along its bar axis by more than an extent of the illumination field along the bar axis;
for the individual field delimiting stops, the bar axis is parallel to a displacement direction of an object configured to be illuminated by the illumination of the illumination field; and
at least some of the individual field delimiting stops are displaceable in the transverse direction.

14. The device of claim 13, wherein the displacement drive comprises:
a first actuator configured to displace the individual field delimiting stops between different intensity correction positions; and
a second actuator configured to displace the individual field delimiting stops between a neutral position, which does not influence the illumination field, and a field delimiting position.

15. An optical unit configured to guide illumination light toward an illumination field of a lithographic projection exposure apparatus, the optical unit comprising:
the device of claim 13.

16. A system, comprising:
an illumination system comprising an illumination optical unit configured to guide illumination light toward an illumination field of a lithographic projection exposure apparatus, the optical unit comprising the device of claim 13; and
a projection optical unit configured to image an object field into an image field,
wherein the object field coincides at least in sections with the illumination field.

17. A projection exposure apparatus, comprising:
a light source configured to provide illumination light;
an illumination system comprising an illumination optical unit configured to guide illumination light toward an illumination field of a lithographic projection exposure apparatus, the optical unit comprising the device of claim 13; and
a projection optical unit configured to image an object field into an image field,
wherein the object field coincides at least in sections with the illumination field.

18. A method of using a projection exposure apparatus comprising an illumination system and a projection optical unit, the method comprising:
using the illumination system to illuminate at least a part of a reticle; and
using the projection optical unit to project at least part of the illumination part of the reticle onto a wafer,
wherein the illumination system comprises the optical unit comprising the device of claim 13.

* * * * *

UNITED STATES PATENT AND TRADEMARK OFFICE
CERTIFICATE OF CORRECTION

PATENT NO. : 10,067,424 B2
APPLICATION NO. : 14/500370
DATED : September 4, 2018
INVENTOR(S) : Martin Endres and Toralf Gruner Page 1 of 1

It is certified that error appears in the above-identified patent and that said Letters Patent is hereby corrected as shown below:

In the Specification

In Column 1, Line 37, delete "transversly" and insert -- transversely --, therefor.

Signed and Sealed this
Twenty-sixth Day of March, 2019

Andrei Iancu
*Director of the United States Patent and Trademark Office*